United States Patent [19]
Levinson et al.

[11] Patent Number: 6,159,643
[45] Date of Patent: Dec. 12, 2000

[54] EXTREME ULTRAVIOLET LITHOGRAPHY REFLECTIVE MASK

[75] Inventors: Harry Levinson, Saratoga; Khanh B. Nguyen, San Mateo, both of Calif.

[73] Assignee: Advanced Micro Devices, Inc., Sunnyvale, Calif.

[21] Appl. No.: 09/258,959

[22] Filed: Mar. 1, 1999

[51] Int. Cl.$^7$ .................................................. G03F 9/00
[52] U.S. Cl. ................................................................ 430/5
[58] Field of Search ............................... 430/5, 322, 323; 378/34, 35; 428/336, 426, 428

[56] References Cited

U.S. PATENT DOCUMENTS

| | | | |
|---|---|---|---|
| 4,632,871 | 12/1986 | Karnezos et al. | 428/336 |
| 4,676,193 | 6/1987 | Martin | 118/720 |
| 5,112,707 | 5/1992 | Kato et al. | 430/5 |
| 5,160,560 | 11/1992 | Welkowsky et al. | 156/154 |
| 5,200,363 | 4/1993 | Schmidt | 437/208 |
| 5,315,629 | 5/1994 | Jewell et al. | 378/34 |
| 5,349,207 | 9/1994 | Malhi | 257/76 |
| 5,399,231 | 3/1995 | McCarthy | 156/630 |
| 5,441,776 | 8/1995 | Sterling et al. | 428/1 |
| 5,510,230 | 4/1996 | Tennant et al. | 430/311 |
| 5,521,031 | 5/1996 | Tennant et al. | 430/5 |
| 5,549,994 | 8/1996 | Watanabe et al. | 430/5 |
| 5,691,541 | 11/1997 | Ceglio et al. | 250/492.1 |
| 5,798,528 | 8/1998 | Butsch et al. | 250/492.2 |
| 6,048,652 | 4/2000 | Nguyen et al. | 430/5 |

OTHER PUBLICATIONS

"EUV Reticle Pattern Repair Experiments using 10 KeV Neon Ions", from Extreme Ultraviolet Lithography, 1994, 5 pages.

"Optical Fabrication and Testing", Surface Characterization of Optics for EUV Lithography, 1996 Technical Digest Serial, vol. 7, Postconference Edition, 5 pages.

"An approach using a subamorphizing threshold dose silicon implant of optimal energy to achieve shallower junctions", Journal of Applied Physics, vol. 83, No. 12, Jun. 15, 1998, 5 pages.

"EUV Lithography", Solid State Technology, Jul., 1997, 6 pages.

"Use of Low Energy Ion for Achieving Ultra–Shallow Junctions", Akif Sultan, PhD., The University of Texas at Austin, 1996.

*Primary Examiner*—S. Rosasco
*Attorney, Agent, or Firm*—Renner, Otto, Boisselle & Sklar, LLP

[57] ABSTRACT

A reflective lithography mask (12) includes a pattern-producing portion (200) and a substrate (300) supporting the pattern-producing portion on its top surface. The pattern-producing portion has reflective regions and non-reflective regions corresponding to a desired circuit pattern. The substrate (300) comprises a top layer (306) having a top surface with an optical flatness in the range of at least a quarter-wavelength and a bottom layer (304) having a coefficient of thermal expansion less than about 1.0 ppm/° C. The reflective mask (12) is used in a lithography method to delineate a latent image of a desired circuit pattern (preferably having design rules of 0.18 $\mu$m and less) onto a wafer (14) by illuminating the mask (12) with radiation (preferably having a wavelength of 3 nm to 50 nm) so as to reflect radiation from the reflective regions of the mask onto the wafer (14).

27 Claims, 2 Drawing Sheets

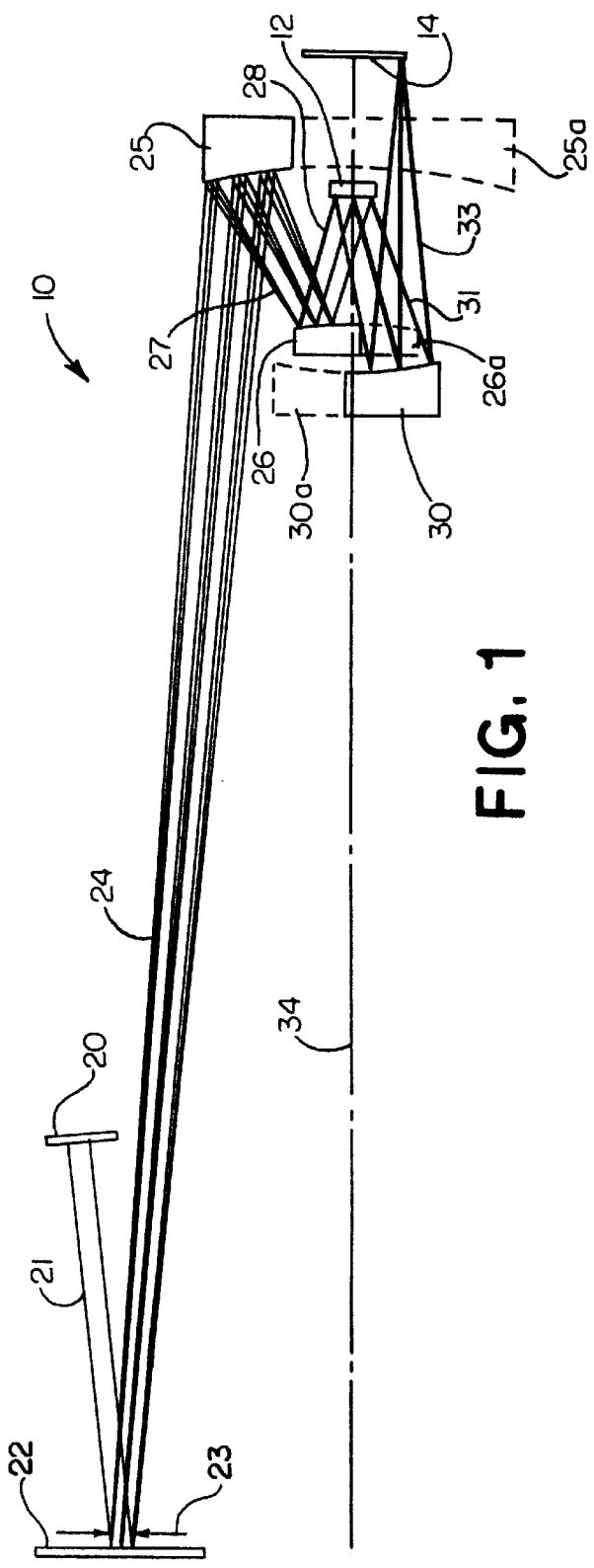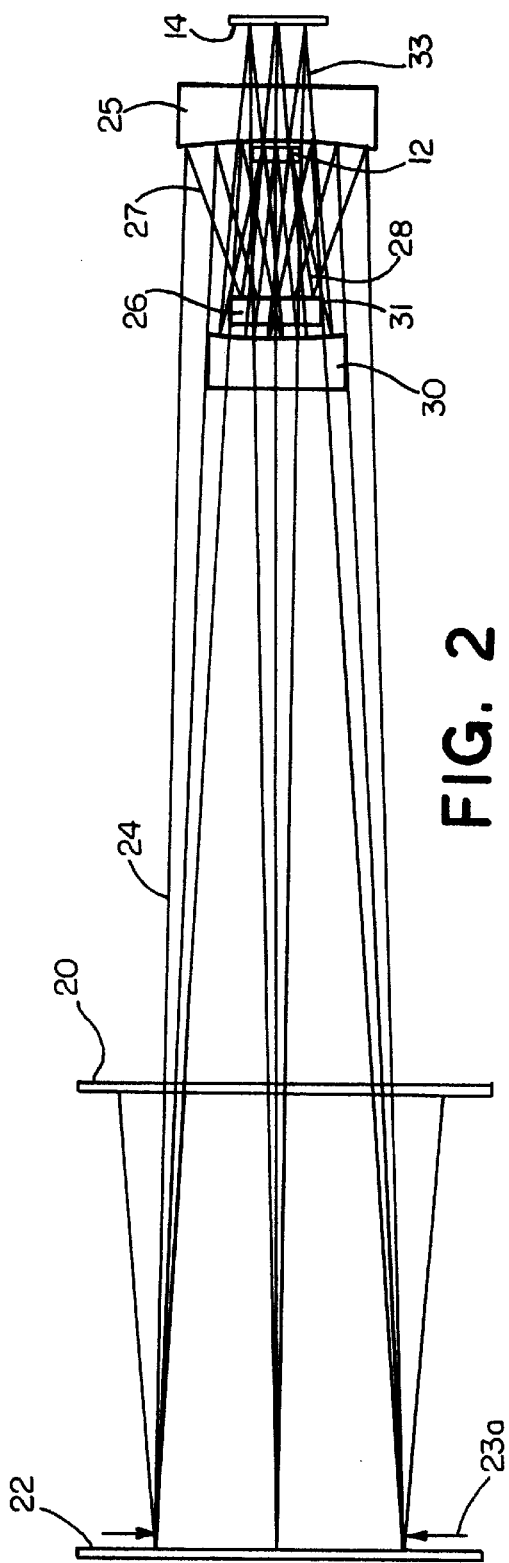

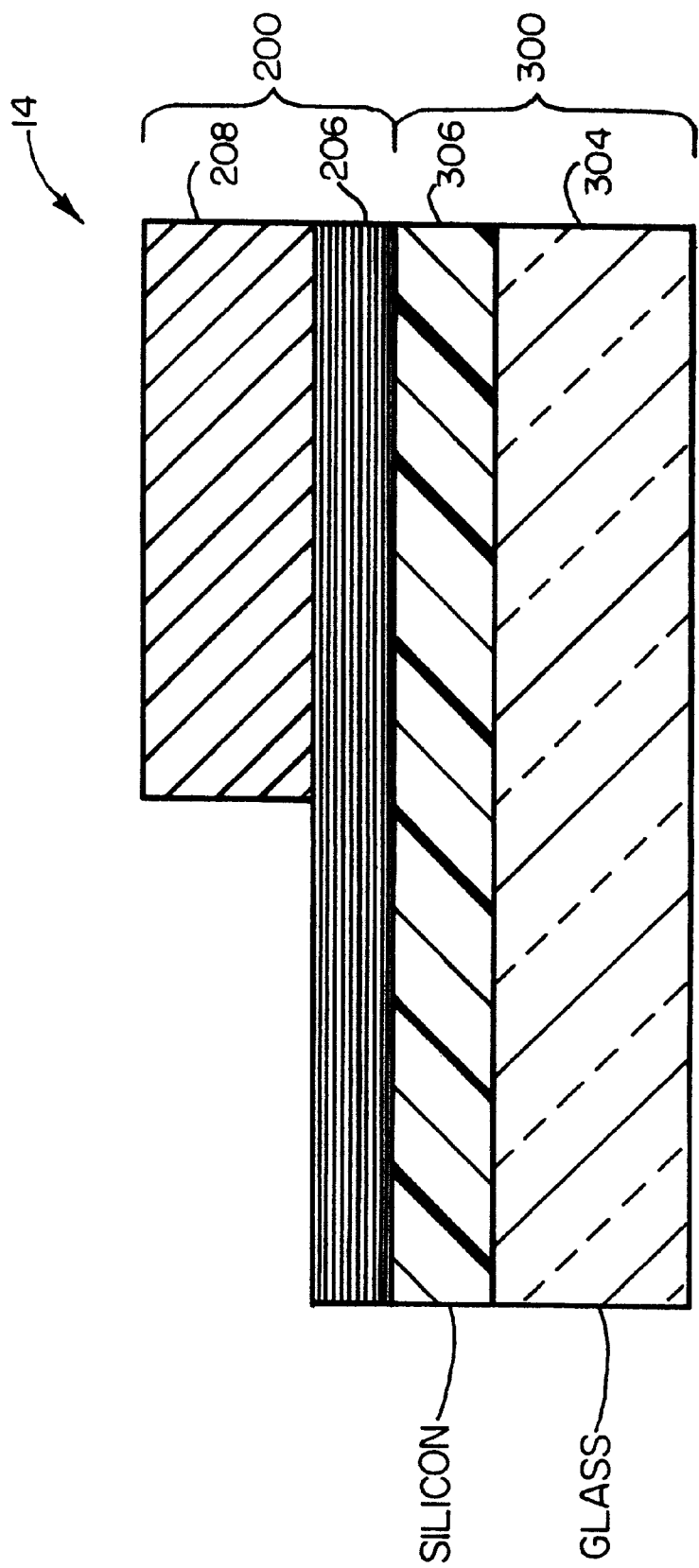

EXTREME ULTRAVIOLET LITHOGRAPHY REFLECTIVE MASK

FIELD OF THE INVENTION

This invention relates generally to a reflective mask for use in an extreme ultraviolet lithography method.

BACKGROUND OF INVENTION

Integrated circuit fabrication techniques vary greatly depending on the specific chip structure being made, the exact processes being used, and/or the available equipment. However, almost all fabrication methods include a lithography process during which certain regions of a wafer (i.e., a silicon slice coated with a photoresist material) are exposed to radiation to delineate a latent image corresponding to the desired circuit pattern. The radiation-exposed wafer is then developed, etched, and processed to form an integrated circuit.

The technical advances in lithography processes have been significant. Integrated circuits built to design rules at or slightly below 0.25 $\mu$m are common with the use of radiation in the deep ultraviolet wavelength. Radiation in the extreme ultraviolet (EUV) range (3 nm to 50 nm wavelength—also referred to as "soft x-ray") has been found useful for the fabrication of devices having design rules of 0.18 $\mu$m and is prospectively useful for even smaller design rules, such as 0.10 $\mu$m and smaller.

During the past eight years, EUV lithography has evolved from a simple concept into a possible candidate for mass commercial production of integrated circuits. Projection lithography, and particularly reflective (rather than transmission) projection lithography, is believed to be the best route to industrial production of integrated circuits by use of EUV lithography. In such a system, EUV radiation is projected onto a lithography mask having reflective regions and non-reflective regions corresponding to the desired circuit pattern. The beams reflected from the mask are then demagnified and projected onto the wafer.

Of particular interest in the present invention is the reflective mask used in EUV projection lithography. A reflective EUV mask may be viewed as comprising a pattern-producing portion and a substrate supporting the pattern-producing portion on top thereof. The pattern-producing portion comprises a reflective coating on the substrate layer and a plurality of absorbing blocks covering selective regions of the reflective coating. The absorbing blocks and the covered regions of the reflective coating form non-reflective regions of the mask. The uncovered portions of the reflective coating form the reflective regions of the mask.

Since the reflective coating is applied to a top surface of the substrate, it is important that this surface be as flat as possible. Otherwise, the substrate's non-smoothness will be translated (and perhaps exaggerated) in the coating thereby affecting its reflecting accuracy. Another issue which must be taken into consideration with a reflective EUV mask is expansion due to thermal conditions. Specifically, because the absorbing blocks (or non-reflective regions) of the mask absorb rather than reflect the radiation, they absorb heat and this heat is conducted through the reflective coating to the substrate. If the substrate expands upon conduction of this heat, this expansion could cause variations in the mask's dimensions that result in registration errors.

As far as flatness is concerned, silicon is usually the substrate material of choice. The top surface of a silicon slice may be polished to have excellent surface flatness specifications. However, silicon, has a relatively high coefficient of thermal expansion (CTE), specifically 2.5 ppm/° C. Thus, despite its "flatness" attributes, a silicon substrate may present thermal expansion issues.

Accordingly, the inventor appreciated that a need remains for a reflective lithography mask which accommodates both optical flatness concerns and thermal expansion concerns without having to make a significant compromise therebetween.

SUMMARY OF THE INVENTION

The present invention provides a reflective lithography mask that accommodates both optical flatness concerns and thermal expansion concerns during a lithography process and particularly during an EUV lithography process.

More particularly, the present invention provides a reflective lithography mask comprising a pattern-producing portion and a substrate supporting the pattern-producing portion on its top surface. The pattern-producing portion has reflective regions and non-reflective regions corresponding to a desired circuit pattern. The substrate comprises a top layer having a top surface with an optical flatness suitable for EUV lithography transmission and a bottom layer having a coefficient of thermal expansion coefficient less than 1.0 ppm/° C.

The reflective mask is used in a lithography method to delineate a latent image of a desired circuit pattern (preferably having design rules of 0.18 $\mu$m and less) onto a wafer. In this lithography method, the mask is illuminated with radiation (preferably having a wavelength of 3 nm to 50 nm) and the radiation is reflected from the reflective regions of the mask onto the wafer. Preferably, the substrate's top layer is made of silicon. Additionally or alternatively, the second substrate layer is preferably made of a glass, a ceramic, or a low expansion metal.

These and other features of the invention are fully described and particularly pointed out in the claims. The following description and drawings set forth in detail a certain illustrative embodiment of the invention, this being indicative, however, of but one of the various ways in which the principles of the invention may be employed.

DRAWINGS

FIGS. 1 and 2 are schematic side and top views, respectively, of an EUV lithography system incorporating a reflective mask according to the present invention.

FIG. 3 is a fragmentary cross-sectional view of a portion of the reflective mask.

DETAILED DESCRIPTION

Referring now to the drawings in detail and initially to FIGS. 1 and 2, an EUV lithography system 10 incorporating a reflective mask 12 according to the present invention is schematically shown. As is explained in more detail below, the reflective mask 12 is designed to accommodate both optical flatness concerns and thermal expansion concerns without having to make a significant compromise therebetween.

The system 10 is designed to delineate a latent image of a desired circuit pattern (having feature dimensions of 0.18 $\mu$m and less) onto a wafer 14 by illuminating the reflective mask 12 to thereby reflect radiation onto the wafer 14. The radiation-exposed wafer is then developed, etched, and processed to form an integrated circuit. To this end, the wafer 14 is fabricated to allow the latent image to be created thereon while at the same time allowing subsequent etching to be performed. For example, the wafer 14 may comprise a silicon substrate having one side coated in sequential order with an organic material, germanium, and an EUV-sensitive material. The EUV-sensitive material coating, which forms the exposure side of the wafer, is sufficiently thin to allow full absorption of EUV radiation so that the entire thickness of the radiation-exposed areas of the wafer will be removed during development. The underlying germanium and organic material coatings serve in succession as barriers during the etching steps.

The lithography system 10 includes an EUV radiation source 20 producing a beam 21 having a wavelength of 3 nm to 50 nm. FIGS. 1 and 2 are simplified schematic representations of such a system whereby certain components are not specifically shown. For example, the source 20 may be a synchrotron or a laser plasma source and preferably includes optical filtering elements and a condenser. Also, the reflective mask 12 and the wafer 14 are preferably mounted to stages and a scanner scans the mask 12 and the wafer 14 in a direction and at a speed to accommodate the desired mask-to-image reduction.

In the illustrated system 10, the radiation source 20 produces a beam 21 that illuminates the reflective mask 12 over a slit having a width 23 and a length 23a. The diverging beam 24 reflected therefrom is reflected by a concave mirror 25 so as to illuminate a convex mirror 26 with the now converging beam 27. Reflection of the beam 27 from the convex mirror 26 results in a beam 28 which illuminates a concave folding mirror 29. This results in the illumination of a concave mirror 30 by a now diverging beam 31. The beam 31 illuminates a mirror 30 to produce a focused image on the wafer 14 by means of a beam 33 to thereby expose certain portions of the wafer to EUV radiation.

Referring now to FIG. 3, the reflective mask 12 according to the present invention is shown. The mask 12 comprises a pattern-producing portion 200 and a substrate 300 supporting the imaging-producing portion 200 on a top surface thereof. The pattern-producing portion 200 comprises a reflective coating 206 and a plurality of absorbing blocks 208. The reflective coating 206 is applied to the top surface of the substrate 300 to create a "blank." The absorbing blocks 208 are shaped, sized and arranged on the top of the reflective coating 206 to cover regions thereof in a manner corresponding to the desired circuit pattern. In this manner, the pattern-producing portion 200 provides reflective and non-reflective regions. Specifically, blocks 208 and the block-covered regions of the coating 206 form the non-reflective regions of the mask 12. The uncovered regions of the coating 206 form the reflective regions of the mask.

The reflective coating 206 is preferably a multi-layer mirror having layers of high and low refractive index materials that introduce a phase delay of one or more wavelengths so that the composite reflection is single phase. In other words, the reflective coating 206 is preferably a Distributed Braggs Reflector (DBR). Silicon/molybdenum multi-layer mirrors may be used in the 13 nm–15 nm wavelength range; molybdenum/beryllium multi-layer mirrors may be used in the 11.4 nm wavelength range; and ruthenium/boron carbide multi-layer mirrors may be used in the 6.8 nm wavelength range.

The absorbing blocks 208 may be made primarily of a high absorption material, such as gold, germanium, and other heavy metals. Alternatively, the absorbing blocks 208 may be made of a combination of such high absorption materials and phase-shifting materials, such as is suggested in U.S. Pat. No. 5,510,230, the entire disclosure of which is hereby incorporated by reference. In either case, the patterning of the absorbing blocks 208 on the reflective coating 206 may be accomplished by electron beam writing or ion beam sputter deposition.

The substrate 300 comprises two layers 304 and 306. The bottom layer 304 forms the lower level of the substrate 300. The top layer 306 forms the upper level of the substrate 300 and is positioned on top of the bottom layer 304. The reflective coating 206 is applied to the top surface of the layer 306. The bottom layer 304 preferably extends entirely across the lower surface of the top layer 304. At the very least, the bottom layer 304 is positioned beneath the central portion of the lower surface of the top layer 304.

The bottom substrate layer 304 has a low coefficient of thermal expansion less than about 1.0 ppm/° C. and preferably less than about 0.5 ppm/° C. The top layer 306 has a top surface having an optical flatness suitable for EUV lithography techniques, such as one quarter wavelength or better. In this manner, the substrate 300 provides a very flat surface for the application of the reflective coating 206 while at the same time remains thermally stable to prevent registration and other errors. In the preferred mask 12, the first substrate layer 304 is silicon and the second substrate layer 306 is low expansion glass, ceramic or metal. For example, fused silica having a CTE of about 0.5 ppm/° C. may be used to form the second substrate layer 306 or ULE™ having a CTE of about 0.02 ppm/° may be used to form the second substrate layer 306. The bottom layer 304 preferably is at least as thick as the top layer 306, more preferably is thicker than the top layer 306, and even more preferably is at least twice as thick as the top layer 306.

The layers 304 and 306 may be bonded together in any suitable manner. For example, the lower surface of the top layer 306 may be bonded to the upper surface of the bottom layer 306 through an adhesive. The adhesive type may be, for example, solvent type, heat curable type, or photocurable type appropriately selected from epoxy series, rubber series, and other series adhesives.

Alternatively, the layers 304 and 306 may be bonded together using an anodic bonding technique. Anodic bonding relies on charge migration to produce bonded wafers and is especially suited for situations wherein the bottom layer 304 is a glass composition with a high content of alkali metals. The presence of mobile metals is exploited by applying a negative potential to the glass to attract positive ions to the negative electrode, where they are neutralized. This permits the formation of a space charge at the glass-silicon interface, which creates a strong electrostatic attraction between the silicon top layer 306 and the glass bottom layer 304 that holds both pieces firmly in place.

Another possible bonding technique may be eutectic or glass-frint bonding. In an eutectic bonding technique, a metallic intermediate film is deposited and pressure is applied while the layers are maintained at the appropriate eutectic temperature. The bonding is formed by solid by solid-liquid interdiffusion at the interface, followed by solidification upon cooling. In a glass-frit bonding technique, a thin glass layer is deposited on one of the interfacing surfaces and the layers 304 and 306 are brought into contact at the rated melting temperature of the glass.

One may now appreciate the present invention provides a reflective lithography mask 12 that accommodates both optical flatness concerns and thermal expansion concerns without having to make a significant compromise therebetween. Although the invention has been shown and described with respect to a preferred embodiment, other equivalent modifications and alterations will occur to those skilled in the art. The invention includes all such modifications and alterations and is limited only by the scope of the following claims.

What is claimed is:

1. A reflective lithography mask comprising a pattern-producing portion and a substrate;
    the substrate supporting the pattern-producing portion on a top surface thereof;
    the pattern-producing portion having reflective regions and non-reflective regions corresponding to a desired circuit pattern;
    the substrate comprising a top layer having a top surface with an optical flatness of one-quarter wavelength or better and a bottom layer having a coefficient of thermal expansion less than about 1.0 ppm/° C.

2. A reflective lithography mask as set forth in claim 1 wherein the bottom layer is positioned beneath a central portion of a lower surface of the top layer.

3. A reflective lithography mask as set forth in claim 2 wherein the bottom layer extends substantially entirely across the lower surface of the top layer.

4. A reflective lithography mask as set forth in claim 3 wherein the substrate's top layer comprises silicon.

5. A reflective lithography mask as set forth in claim 4 wherein the second substrate layer comprises a low expansion glass, a low expansion ceramic, or a low expansion metal.

6. A reflective lithography mask as set forth in claim 3 wherein the substrate's top layer comprises silicon.

7. A reflective lithography mask as set forth in claim 6 wherein the bottom layer is at least as thick as the top layer.

8. A reflective lithography mask as set forth in claim 7 wherein the bottom layer is thicker than the top layer.

9. A reflective lithography mask as set forth in claim 8 wherein bottom layer is at least twice as thick as the top layer.

10. A reflective lithography mask as set forth in claim 1 wherein the pattern-producing portion comprises a reflective coating applied to the top surface of the top substrate layer and a plurality of absorbing blocks covering certain regions of the reflective coating, the covered regions of the reflective coating forming the non-reflective regions of the pattern-producing portion and the uncovered regions of the reflective coating forming the reflective regions of the pattern-producing portion.

11. A reflective lithography mask as set forth in claim 10 wherein the reflective coating is a multi-layer mirror.

12. A reflective lithography mask as set forth in claim 11 wherein the multi-layer mirror comprises layers of high and low refractive index materials introducing a phase delay of one or more wavelengths so that a composite reflection is single phase.

13. A reflective lithography mask as set forth in claim 12 wherein the layers of the multi-layer mirror comprise layers selected from one of a group consisting of:
    silicon and molybdenum;
    molybdenum and beryllium; and
    ruthenium and boron carbide.

14. A reflective lithography mask as set forth in claim 10 wherein the absorbing blocks are made of gold or germanium.

15. A lithography method for delineating a latent image of a desired circuit pattern onto a wafer, comprising the step of illuminating the reflective lithography mask set forth in claim 1 with radiation so as to reflect radiation from the reflective regions of the mask onto the wafer.

16. A lithography method as set forth in claim 15 wherein the desired circuit pattern has feature dimensions of 0.18 $\mu$m and less.

17. A lithography method as set forth in claim 15 wherein the radiation has a wavelength of 50 nm to 3 nm.

18. A lithography method as set forth in claim 17 wherein the desired circuit pattern has feature dimensions of 0.18 $\mu$m and less.

19. A blank for a reflective lithography mask comprising a substrate and a multi-layer mirror coating applied to a top surface of the substrate;
    the substrate comprising a top layer having a top surface with an optical flatness of one-quarter wavelength or better and a bottom layer having a coefficient of thermal expansion less than about 1.0 ppm/° C.

20. A blank as set forth in claim 19 wherein the bottom layer is positioned beneath a central portion of a lower surface of the top layer.

21. A blank as set forth in claim 20 wherein the bottom layer extends substantially entirely across the lower surface of the top layer.

22. A blank as set forth in claim 21 wherein the substrate's top layer is silicon.

23. A blank as set forth in claim 21 wherein the bottom substrate layer comprises a low expansion glass, a low expansion ceramic, or a low expansion metal.

24. A blank as set forth in claim 23 wherein the substrate's top layer comprises silicon.

25. A blank as set forth in claim 19 wherein the bottom layer is at least as thick as the top layer.

26. A blank as set forth in claim 25 wherein the bottom layer is thicker than the top layer.

27. A blank as set forth in claim 26 wherein bottom layer is at least twice as thick as the top layer.

* * * * *